US012777587B2

(12) United States Patent
Oie

(10) Patent No.: US 12,777,587 B2
(45) Date of Patent: Oct. 27, 2026

(54) ELECTRONIC COMPONENT WITH (SEPARATE/INTERCONNECTED) ELECTRODES TYPES

(71) Applicant: Murata Manufacturing Co., Ltd., Kyoto-fu (JP)

(72) Inventor: Hirofumi Oie, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 208 days.

(21) Appl. No.: 18/826,758

(22) Filed: Sep. 6, 2024

(65) Prior Publication Data

US 2024/0431024 A1 Dec. 26, 2024

Related U.S. Application Data

(63) Continuation of application No. PCT/JP2023/013828, filed on Apr. 3, 2023.

(30) Foreign Application Priority Data

Apr. 4, 2022 (JP) ................................ 2022-062610

(51) Int. Cl.
*H05K 1/11* (2006.01)
*H05K 3/24* (2006.01)

(52) U.S. Cl.
CPC ............ *H05K 1/112* (2013.01); *H05K 3/244* (2013.01); *H05K 2201/094* (2013.01);
(Continued)

(58) Field of Classification Search
CPC .. H05K 1/112; H05K 3/244; H05K 2201/094; H05K 2201/09409;
(Continued)

(56) References Cited

U.S. PATENT DOCUMENTS 5,995,379 A * 11/1999 Kyougoku ............ H05K 1/144 361/803
6,037,657 A * 3/2000 Tsurumi .............. H05K 3/3436 257/704
(Continued)

FOREIGN PATENT DOCUMENTS

JP 2005-209881 A 8/2005
JP 2005-216999 A 8/2005
(Continued)

OTHER PUBLICATIONS

International Search Report for PCT/JP2023/013828 dated Jun. 20, 2023.

*Primary Examiner* — Timothy J. Dole
*Assistant Examiner* — Muhammed Azam
(74) *Attorney, Agent, or Firm* — McDonald Hopkins LLC

(57) ABSTRACT

An electronic component includes a main body provided with a first surface and a plurality of electrodes arranged on the first surface. The plurality of electrodes include first-type electrodes individually arranged on the first surface and connected to each other through an interconnection that passes through the inside of the main body and a second-type electrode not connected to other electrodes individually arranged on the first surface. The first-type electrodes each include a first underlying electrode and a first plated film that covers the first underlying electrode. The second-type electrode includes a second underlying electrode and a second plated film that covers the second underlying electrode. The first underlying electrode sinks into the main body as compared with the second underlying electrode.

12 Claims, 13 Drawing Sheets

(52) U.S. Cl.
CPC .............. *H05K 2201/09409* (2013.01); *H05K 2201/09472* (2013.01); *H05K 2201/099* (2013.01)

(58) Field of Classification Search
CPC ... H05K 2201/09472; H05K 2201/099; H05K 3/24; H05K 3/46
See application file for complete search history.

(56) References Cited

U.S. PATENT DOCUMENTS

| | | | | |
|---|---|---|---|---|
| 6,060,780 | A * | 5/2000 | Ohta | G01P 1/023 257/E25.031 |
| 6,114,754 | A * | 9/2000 | Kata | H10W 70/688 257/668 |
| 6,271,478 | B1 * | 8/2001 | Horiuchi | H05K 1/112 174/262 |
| 6,751,101 | B2 * | 6/2004 | Sakai | H01F 27/292 174/250 |
| 6,768,062 | B2 * | 7/2004 | Morimoto | H05K 3/3442 361/767 |
| 7,038,144 | B2 * | 5/2006 | Yasuda | H05K 3/3436 257/E23.021 |
| 7,224,424 | B2 * | 5/2007 | Hwang | G02F 1/13452 349/149 |
| 7,323,770 | B2 * | 1/2008 | Moriyama | H03G 3/3042 257/691 |
| 9,204,545 | B2 * | 12/2015 | Hayashi | H05K 1/0271 |
| 10,616,991 | B2 * | 4/2020 | Yazaki | H05K 1/0201 |
| 10,937,707 | B2 * | 3/2021 | Kawagoe | H05K 3/341 |
| 11,166,386 | B2 * | 11/2021 | Yonemori | H05K 3/4629 |
| 11,271,278 | B2 * | 3/2022 | Suzuki | H01P 3/085 |
| 11,283,150 | B2 * | 3/2022 | Arai | H01Q 1/2208 |
| 11,335,614 | B2 * | 5/2022 | Morita | H05K 1/182 |
| 11,508,513 | B2 * | 11/2022 | Adachi | H05K 3/46 |
| 11,574,860 | B2 * | 2/2023 | Goitsuka | H05K 1/113 |
| 12,100,788 | B2 * | 9/2024 | Konishi | H05K 1/0271 |
| 12,262,465 | B2 * | 3/2025 | Jung | H05K 1/0225 |
| 12,568,584 | B2 * | 3/2026 | Tobita | H01F 17/0013 |
| 12,603,231 | B2 * | 4/2026 | Oie | H01G 4/33 |
| 2007/0119616 | A1 * | 5/2007 | Horikawa | H05K 1/16 257/E23.079 |
| 2007/0202682 | A1 * | 8/2007 | Yamamoto | H05K 3/241 257/E23.068 |
| 2014/0353026 | A1 * | 12/2014 | Hattori | H05K 1/113 174/262 |
| 2016/0353568 | A1 | 12/2016 | Lee et al. | |
| 2021/0297057 | A1 * | 9/2021 | Iwamoto | H03H 3/007 |
| 2024/0431024 | A1 * | 12/2024 | Oie | H05K 1/112 |

FOREIGN PATENT DOCUMENTS

| | | | |
|---|---|---|---|
| JP | 2007-305741 | A | 11/2007 |
| JP | 2012-142478 | A | 7/2012 |
| JP | 2015-026835 | A | 2/2015 |
| JP | 2018-166218 | A | 10/2018 |

* cited by examiner

ELECTRONIC COMPONENT WITH (SEPARATE/INTERCONNECTED) ELECTRODES TYPES

CROSS REFERENCE TO RELATED APPLICATION

This is a continuation of International Application No. PCT/JP2023/013828 filed on Apr. 3, 2023 which claims priority from Japanese Patent Application No. 2022-062610 filed on Apr. 4, 2022. The contents of these applications are incorporated herein by reference in their entireties.

BACKGROUND OF THE DISCLOSURE

Field of the Disclosure

The present disclosure relates to an electronic component.

Description of the Related Art

Japanese Patent Laid-Open No. 2005-216999 (PTL 1) describes a multilayer wiring board. A terminal electrode for connection to an external circuit is provided on a bottom surface of this multilayer wiring board. A surface where the terminal electrode is exposed is located in the same plane where a dielectric layer on the bottom surface of the multilayer wiring board is located.

PTL 1: Japanese Patent Laid-Open No. 2005-216999

BRIEF SUMMARY OF THE DISCLOSURE

In order to lower a connection resistance of an electrode formed on a surface of an electronic component, a plated film may be formed on a surface of the electrode. In an example where a plurality of electrodes are arranged on a single surface of the electronic component, plating treatment for these electrodes is collectively performed. An underlying electrode is formed in advance in correspondence with each electrode, and plating treatment is performed by application of a voltage to this underlying electrode.

A plurality of underlying electrodes arranged on the same bottom surface of the electronic component, however, may be different in thickness of an attached plated film. Difference in thickness between the plated films leads to uneven heights of surfaces of the electrodes as a whole inclusive of the underlying electrode and the plated film. Consequently, in mount of the electronic component, electrical connection may not sufficiently be secured in an electrode insufficient in height, and may be defective.

A possible benefit of the present disclosure is to provide an electronic component reduced in variation in height of surfaces of electrodes subjected to plating treatment.

In order to achieve the possible benefit, an electronic component based on the present disclosure includes a main body provided with a first surface and a plurality of electrodes arranged on the first surface. The plurality of electrodes include first-type electrodes individually arranged on the first surface and connected to each other through an interconnection that passes through the inside of the main body and a second-type electrode not connected to other electrodes individually arranged on the first surface. The first-type electrodes each include a first underlying electrode and a first plated film that covers the first underlying electrode. The second-type electrode includes a second underlying electrode and a second plated film that covers the second underlying electrode. The first underlying electrode sinks into the main body as compared with the second underlying electrode.

According to the present disclosure, an electronic component reduced in variation in height of surfaces of electrodes subjected to plating treatment can be provided.

DETAILED DESCRIPTION OF THE DISCLOSURE

Figure 1:
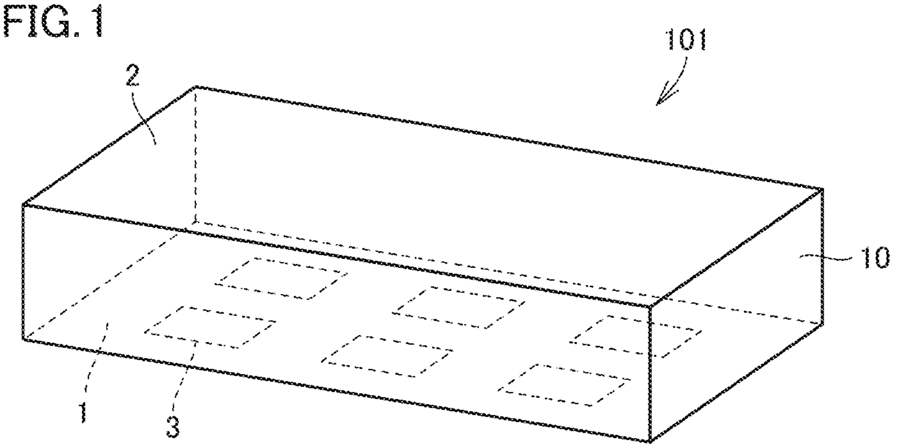
FIG. 1 is a first perspective view of an electronic component in a first embodiment based on the present disclosure.

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

First Embodiment

Figure 2:
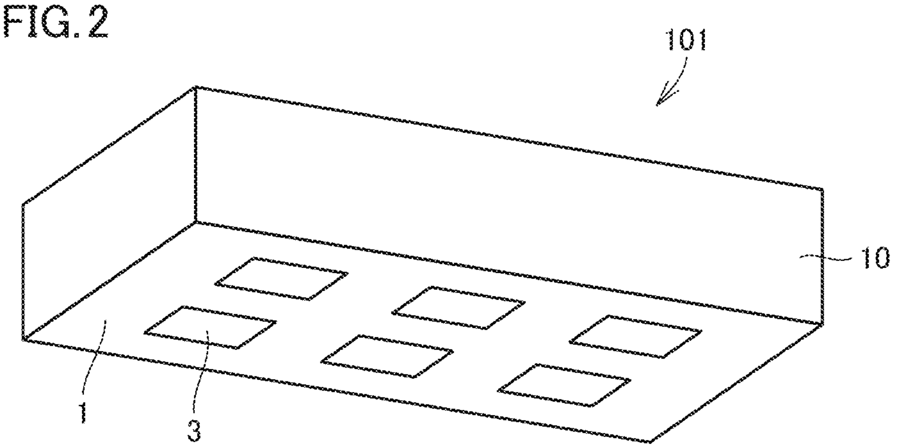
FIG. 2 is a second perspective view of the electronic component in the first embodiment based on the present disclosure.

An electronic component in a first embodiment based on the present disclosure will be described with reference to FIGS. 1 to 5. FIG. 1 shows a perspective view of an electronic component 101 in the present embodiment. FIG. 2 shows electronic component 101 viewed from obliquely below. Electronic component 101 is provided with a first surface 1 and a second surface 2. In FIG. 1, first surface 1 is a lower surface and second surface 2 is an upper surface. A plurality of electrodes 3 are arranged on first surface 1. By way of example, six electrodes 3 are arranged.

Figure 3:
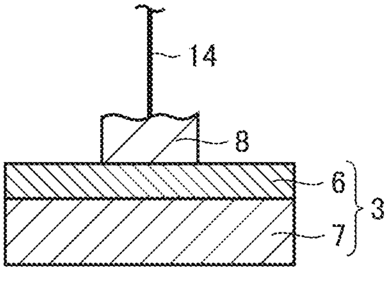
FIG. 3 is a schematic cross-sectional view of an electrode included in the electronic component and an interconnection connected thereto in the first embodiment based on the present disclosure.

FIG. 3 shows a schematic cross-sectional view of electrode 3 and an interconnection connected thereto. Electrode 3 includes an underlying electrode 6 and a plated film 7. Underlying electrode 6 is formed of metal. For example, Cu may be adopted as a material for underlying electrode 6. Plated film 7 grows by plating treatment on underlying electrode 6 as a basis. An interconnection 14 is connected to underlying electrode 6. A via 8 may be interposed between interconnection 14 and underlying electrode 6. Via 8 may be a part of interconnection 14. Though FIG. 3 shows interconnection 14 schematically with a bold straight line, interconnection 14 may actually be implemented by combination of a conductor pattern, a conductor via, and the like contained in a main body 10. Interconnection 14 is schematically shown not only in FIG. 3 but also in some figures below, regardless of its actual geometry.

Figure 4:
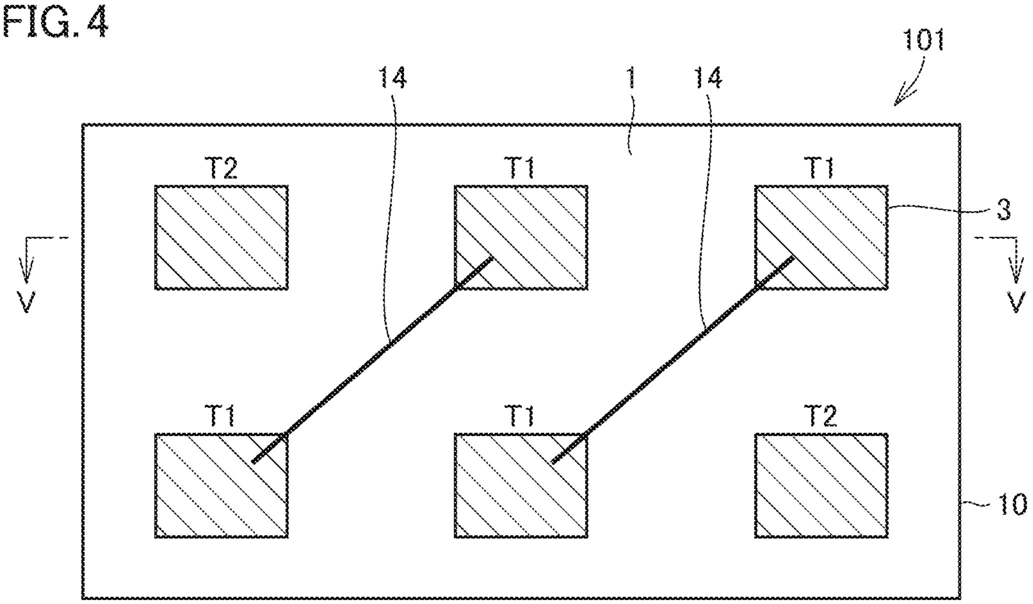
FIG. 4 is a bottom view of the electronic component in the first embodiment based on the present disclosure.
Figure 5:
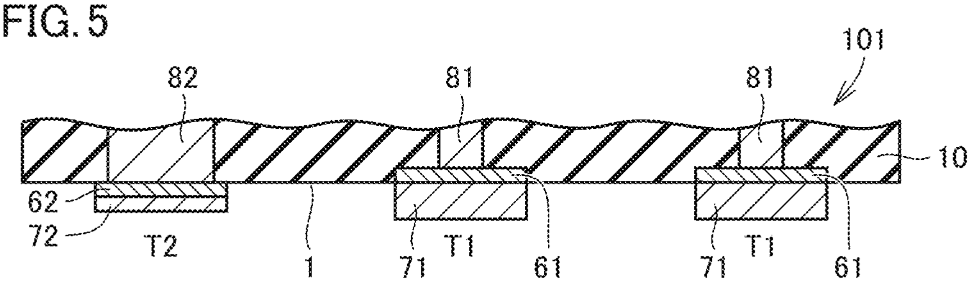
FIG. 5 is a cross-sectional view along the line V-V in FIG. 4.

FIG. 4 shows a bottom view of electronic component 101. For the sake of convenience of description, FIG. 4 shows interconnection 14 that connects electrodes 3 to each other schematically with a bold straight line. Interconnection 14 actually passes over a surface of or through the inside of main body 10. In actual, interconnection 14 is not necessarily viewable when electronic component 101 is viewed from below. A similar representation method is adopted also in embodiments below in showing interconnection 14 in such a bottom view. FIG. 5 shows a cross-sectional view along the line V-V in FIG. 4.

Electronic component 101 in the present embodiment includes main body 10 provided with first surface 1 and a plurality of electrodes 3 arranged on first surface 1. The plurality of electrodes 3 include first-type electrodes T1 individually arranged on first surface 1 and connected to each other through interconnection 14 that passes through the inside of main body 10 and a second-type electrode T2 not connected to other electrodes individually arranged on first surface 1. First-type electrode T1 includes a first underlying electrode 61 and a first plated film 71 that covers first underlying electrode 61. Second-type electrode T2 includes a second underlying electrode 62 and a second plated film 72 that covers second underlying electrode 62. First underlying electrode 61 sinks into main body 10 as compared with second underlying electrode 62. Though FIG. 5 shows second underlying electrode 62 as not sinking into main body 10, second underlying electrode 62 may slightly sink into main body 10. A depth of second underlying electrode 62 sinking into main body 10 is smaller than a depth of first underlying electrode 61 sinking into main body 10.

In plating treatment for formation of electrode 3 on the first surface of electronic component 101, first-type electrode T1 connected to another electrode tends to be faster in growth of plating than second-type electrode T2 not connected to other electrodes. Therefore, first plated film 71 formed for first-type electrode T1 tends to be larger in thickness than second plated film 72 formed for second-type electrode T2. Since first underlying electrode 61 which is a part of first-type electrode T1 sinks into main body 10 as compared with second underlying electrode 62 which is a part of second-type electrode T2 in the present embodiment, in spite of a difference in thickness between their respective plated films formed therein, an electronic component reduced in variation in height of the surfaces of the electrodes subjected to plating treatment can consequently be obtained. In other words, the surfaces of the electrodes subjected to plating treatment are substantially flush with each other. Though the surfaces of the plurality of electrodes are not necessarily exactly flush with each other, they are substantially in such a state.

Further preferably, in the present embodiment, a first via 81 connected to first underlying electrode 61 in the inside of main body 10 and a second via 82 connected to second underlying electrode 62 in the inside of main body 10 are provided, and a cross-sectional area of second via 82 along a plane in parallel to first surface 1 is larger than a cross-sectional area of first via 81 along the plane in parallel to first surface 1. According to this construction, second via 82 is higher in rigidity than first via 81. Therefore, in pressing performed in the middle of fabrication of main body 10 of electronic component 101, first underlying electrode 61 sinks into main body 10, whereas second underlying electrode 62 is less likely to sink into main body 10. The electronic component constructed as described in the present embodiment can thus readily be made.

(Manufacturing Method)

A manufacturing method for obtaining electronic component 101 will be described with reference to FIGS. 6 to 16.

Figure 6:
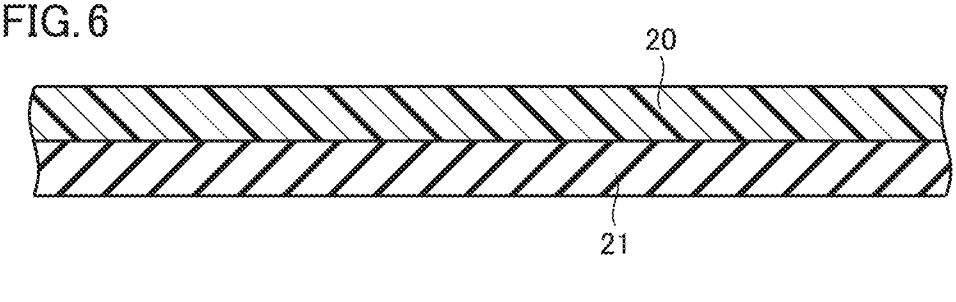
FIG. 6 is an illustrative view of a first step in a method of manufacturing an electronic component in the first embodiment based on the present disclosure.

Initially, as shown in FIG. 6, a ceramic green sheet 21 is prepared. Ceramic green sheet 21 is held on a carrier film 20. In FIG. 6, ceramic green sheet 21 is arranged to cover a lower surface of carrier film 20.

Figure 7:
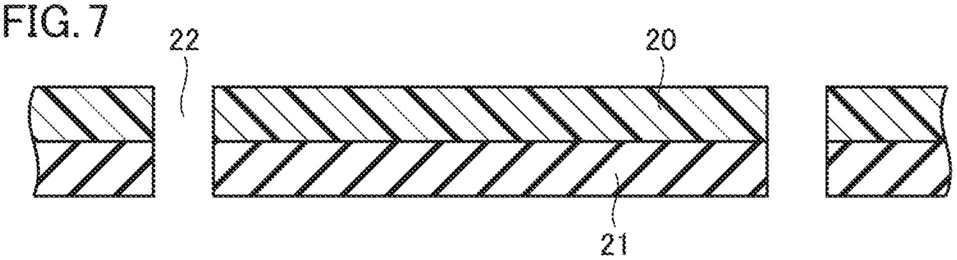
FIG. 7 is an illustrative view of a second step in the method of manufacturing an electronic component in the first embodiment based on the present disclosure.
Figure 8:
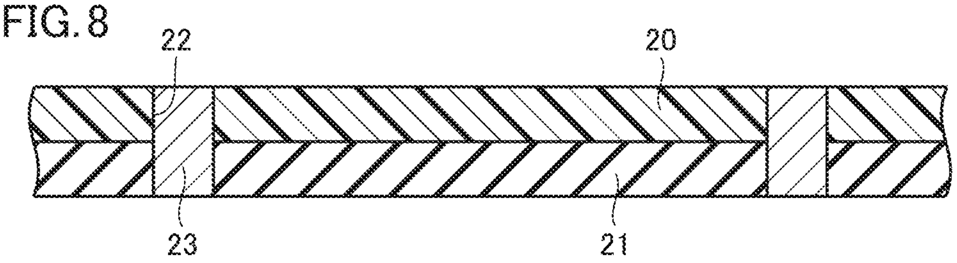
FIG. 8 is an illustrative view of a third step in the method of manufacturing an electronic component in the first embodiment based on the present disclosure.

As shown in FIG. 7, a through hole 22 is then provided. Through hole 22 is provided to pass through carrier film 20 and ceramic green sheet 21 together. Through hole 22 can be provided, for example, by laser machining. As shown in FIG. 8, through hole 22 is filled with a conductive paste 23, and the conductive paste is dried.

Figure 9:
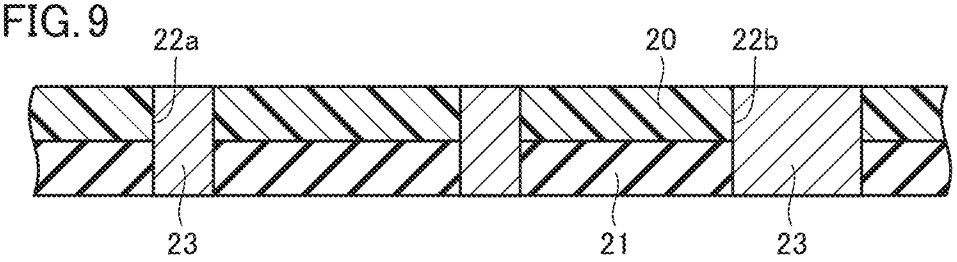
FIG. 9 is an illustrative view of a fourth step in the method of manufacturing an electronic component in the first embodiment based on the present disclosure.

In ceramic green sheet 21 to be arranged at a position closest to first surface 1 in main body 10, as shown in FIG. 9, for example, a through hole 22*a* and a through hole 22*b* are different from each other in opening area. Consequently, an amount of conductive paste filled in through hole 22*b* is larger than an amount of conductive paste 23 filled in through hole 22*a*.

Figure 10:
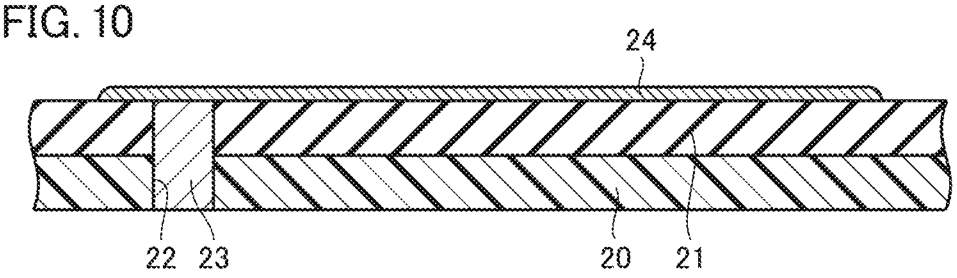
FIG. 10 is an illustrative view of a fifth step in the method of manufacturing an electronic component in the first embodiment based on the present disclosure.

As shown in FIG. 10, a conductor pattern 24 is then formed on a surface of ceramic green sheet 21 as necessary. Conductor pattern 24 can be formed, for example, by printing a conductive paste onto the surface of ceramic green sheet 21. Printing here may be, for example, screen printing. Conductor pattern 24 may be formed by another method without being limited to printing. Conductor patterns 15 and 17 which will be mentioned later may be formed as conductor pattern 24.

Figure 11:
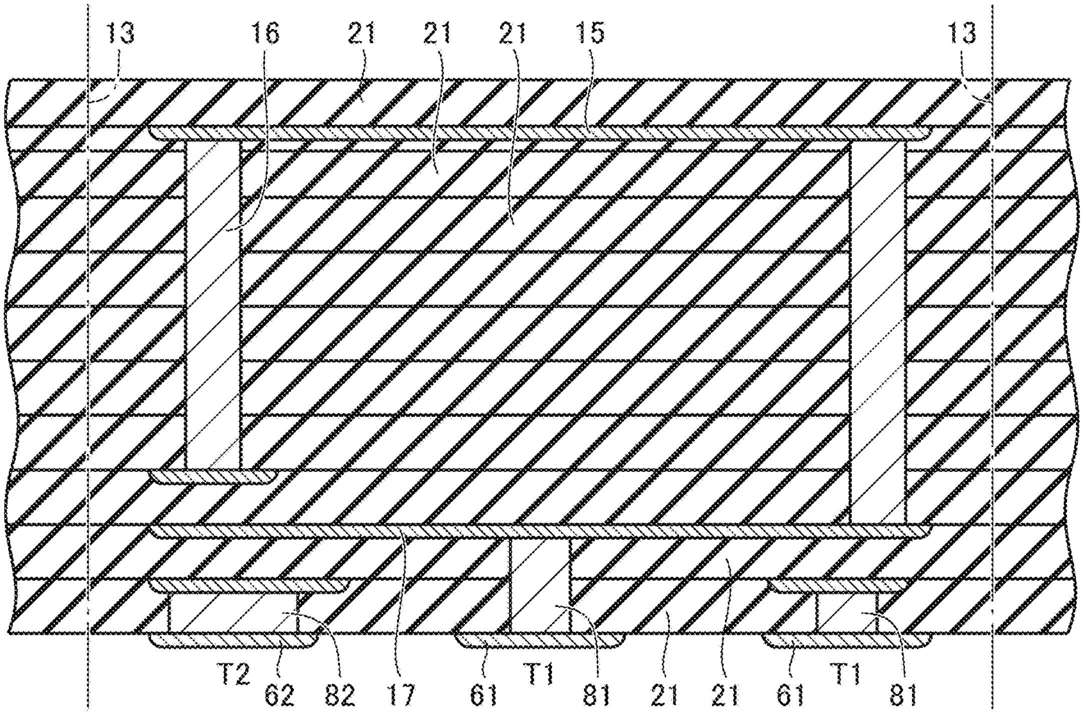
FIG. 11 is an illustrative view of a sixth step in the method of manufacturing an electronic component in the first embodiment based on the present disclosure.

Ceramic green sheet 21 is separated from carrier film 20 and layered. As a plurality of ceramic green sheets 21 are layered, a multilayer body is formed as shown in FIG. 11. Each step proceeds, with a substrate assembly corresponding to a plurality of electronic components being assumed. Though the multilayer body extends also to the right and the left in FIG. 11, a portion corresponding to single electronic component 101 is shown in the center. FIG. 11 shows a state of a substrate assembly before division into a size of an individual product. FIG. 11 shows also a cut plane 13. Cut plane 13 is a plane along which cutting will be performed.

Figure 12:
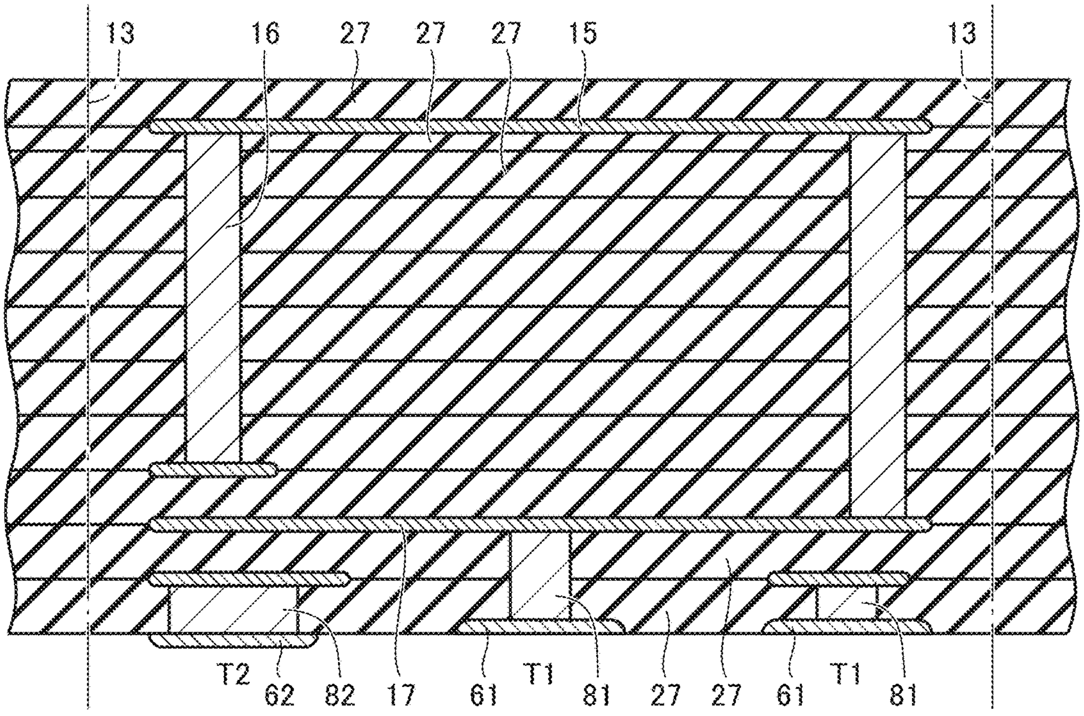
FIG. 12 is an illustrative view of a seventh step in the method of manufacturing an electronic component in the first embodiment based on the present disclosure.

The multilayer body shown in FIG. 11 is pressed. In FIG. 12 or later which shows a step after pressing, each ceramic green sheet 21 is called an "insulating layer 27." After pressing, as shown in FIG. 12, some of conductor patterns arranged on the lower surface sink into lowermost insulating layer 27. Specifically, first underlying electrode 61 sinks greatly, whereas second underlying electrode 62 sinks slightly or does not substantially sink.

Figure 13:
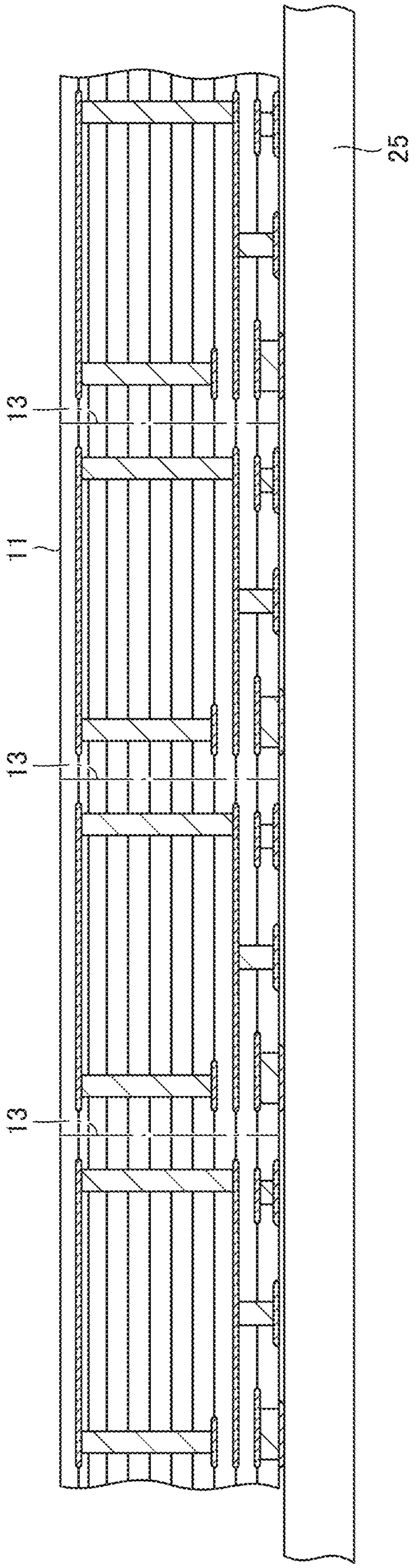
FIG. 13 is an illustrative view of an eighth step in the method of manufacturing an electronic component in the first embodiment based on the present disclosure.
Figure 14:
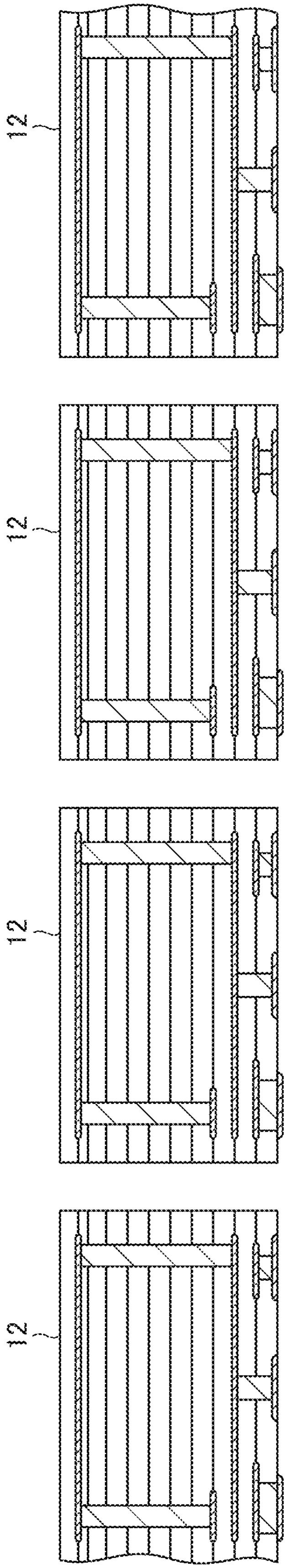
FIG. 14 is an illustrative view of a ninth step in the method of manufacturing an electronic component in the first embodiment based on the present disclosure.
Figure 15:
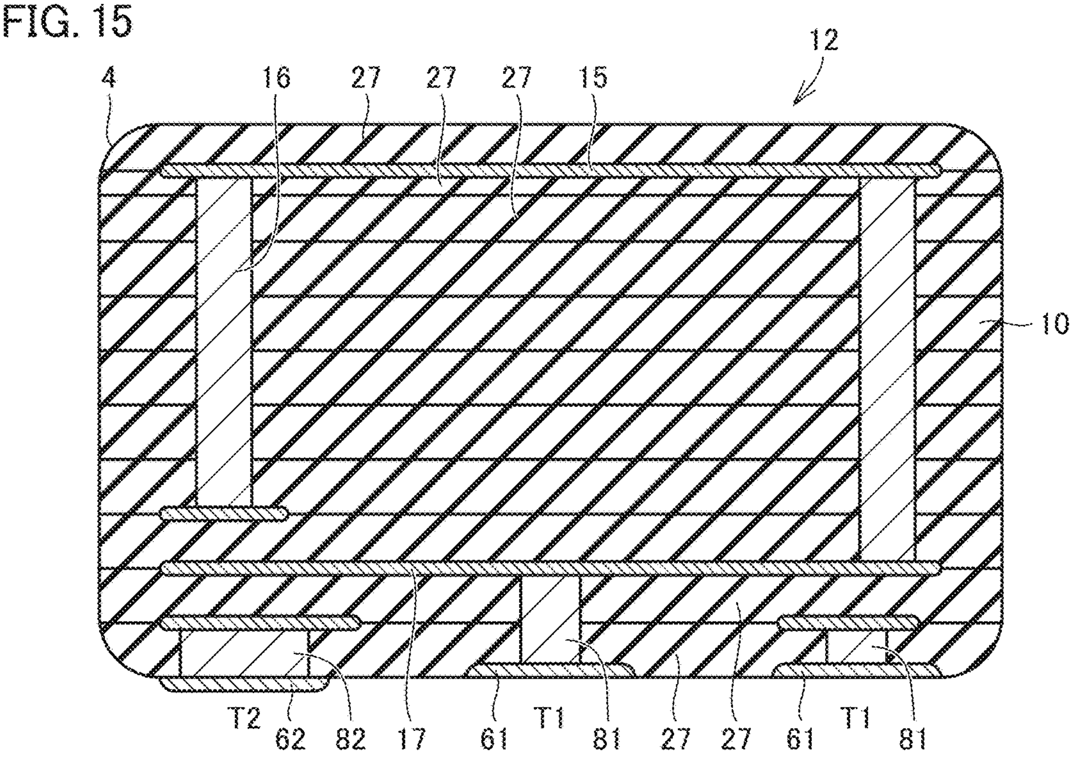
FIG. 15 is an illustrative view of a tenth step in the method of manufacturing an electronic component in the first embodiment based on the present disclosure.

Steps so far are performed in a state of a substrate assembly 11 as shown in FIG. 13. Substrate assembly 11 is held by an adhesive carrier sheet 25. Substrate assembly 11 is cut along cut plane 13. Cutting may be performed, for example, by dicing. As a result of cutting of substrate assembly 11 and removal from carrier sheet 25, a plurality of elemental bodies 12 as shown in FIG. 14 are obtained. Elemental body 12 is subjected to barrel polishing. Consequently, a corner of elemental body 12 is rounded as shown in FIG. 15. The corner of elemental body 12 is provided with a curved portion 4.

Figure 16:
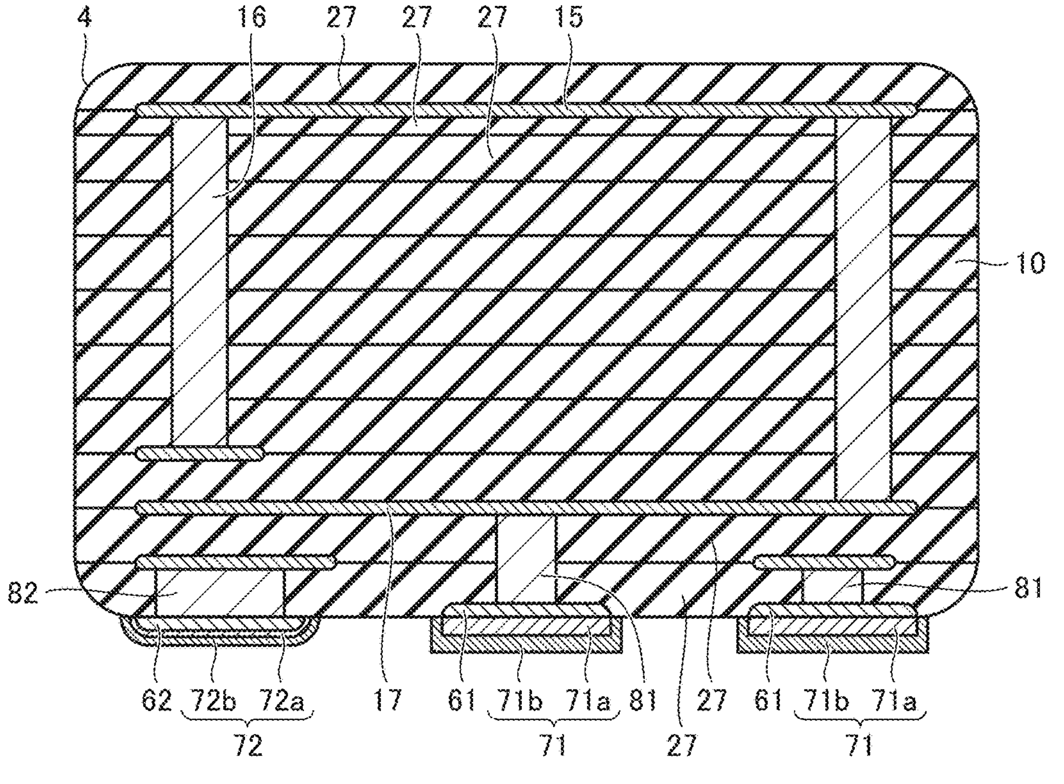
FIG. 16 is an illustrative view of an eleventh step in the method of manufacturing an electronic component in the first embodiment based on the present disclosure.

Plating treatment is further performed. Consequently, as shown in FIG. 16, a plated film is formed to cover first underlying electrode 61 and second underlying electrode 62 located on the lower surface. Specifically, first plated film 71 is formed to cover first underlying electrode 61 and the second plated film is formed to cover second underlying electrode 62. These plated films are each, for example, in a two-layered structure. In the example shown here, first plated film 71 includes a plated film 71*a* and a plated film 71*b*. Second plated film 72 includes a plated film 72*a* and a plated film 72*b*. Plated film 71*a* and plated film 72*a* are identical in material to each other, and they are simultaneously formed. Plated film 71*b* and plated film 72*b* are identical in material to each other, and they are simultaneously formed.

Second Embodiment

Figure 17:
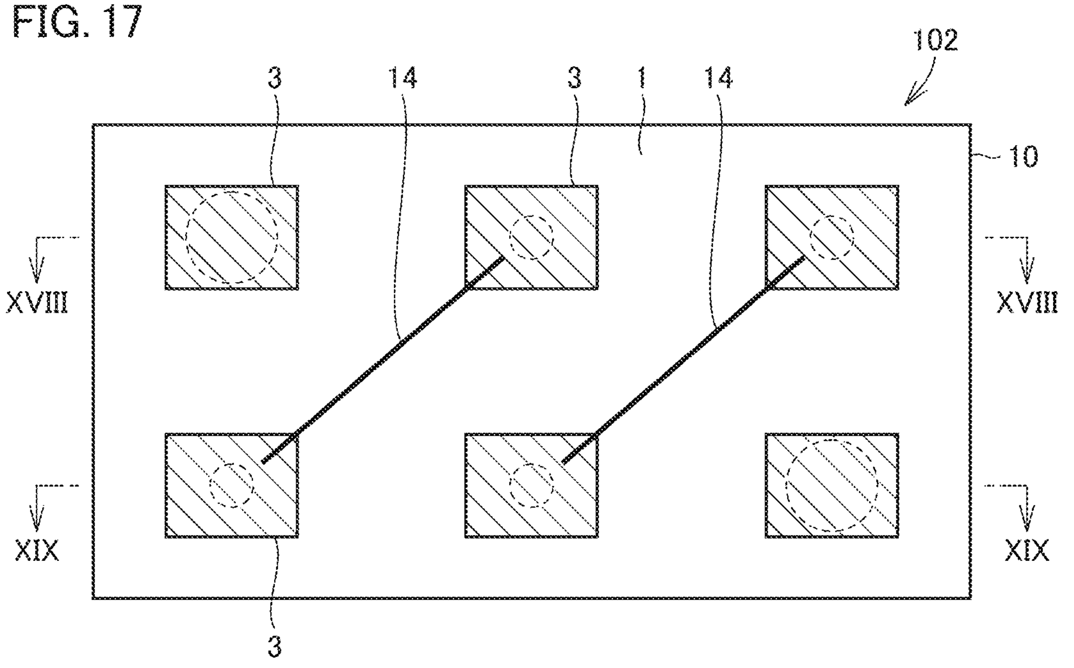
FIG. 17 is a bottom view of an electronic component in a second embodiment based on the present disclosure.
Figure 18:
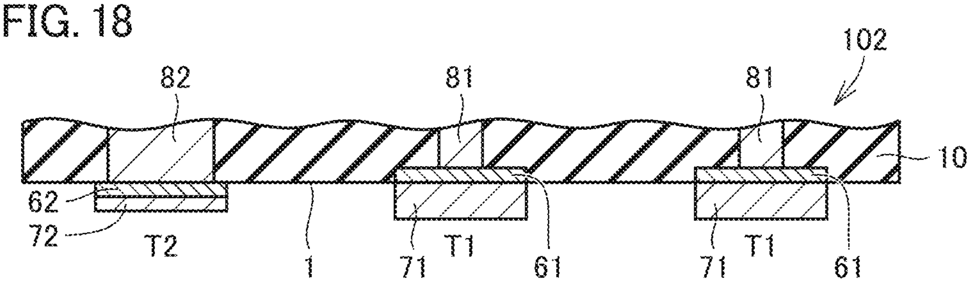
FIG. 18 is a cross-sectional view along the line XVIII-XVIII in FIG. 17.
Figure 19:
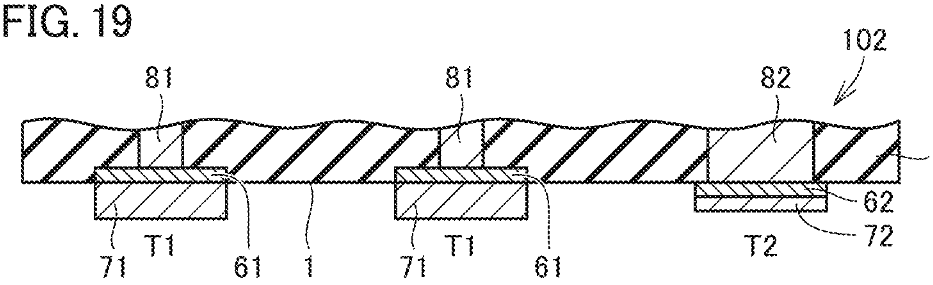
FIG. 19 is a cross-sectional view along the line XIX-XIX in FIG. 17.

An electronic component in a second embodiment based on the present disclosure will be described with reference to FIGS. 17 to 19. FIG. 17 shows a bottom view of an electronic component 102 in the present embodiment. FIG. 18 shows a cross-sectional view along the line XVIII-XVIII in FIG. 17. FIG. 19 shows a cross-sectional view along the line XIX-XIX in FIG. 17.

Electronic component 102 includes a plurality of electrodes 3. The plurality of electrodes 3 include first-type electrodes T1 individually arranged on first surface 1 and connected to each other through interconnection 14 that passes through the inside of main body 10 and second-type electrode T2 not connected to other electrodes individually arranged on first surface 1. In this example, as shown in FIG. 17, four first-type electrodes T1 and two second-type electrodes T2 are arranged on first surface 1. Electronic component 102 includes first via 81 connected to first underlying electrode 61 in the inside of main body 10 and second via 82 connected to second underlying electrode 62 in the inside of main body 10. As shown in FIGS. 18 and 19, the cross-sectional area of second via 82 along the plane in parallel to first surface 1 is larger than the cross-sectional area of first via 81 along the plane in parallel to first surface 1. In other words, first via 81 and second via 82 are different from each other in diameter. Second via 82 is larger in diameter than first via 81.

The present embodiment can also obtain the effect as described in the first embodiment. First via 81 connected to first underlying electrode 61 and second via 82 connected to second underlying electrode 62 are different in cross-sectional area along the plane in parallel to first surface 1, and second via 82 is larger in cross-sectional area and hence higher in rigidity. Therefore, in pressing, first underlying electrode 61 sinks into main body 10, whereas second underlying electrode 62 is less likely to sink into main body 10. Consequently, as shown in FIGS. 18 and 19, variation in height of the surfaces of the electrodes subjected to plating treatment can be reduced.

Third Embodiment

Figure 20:
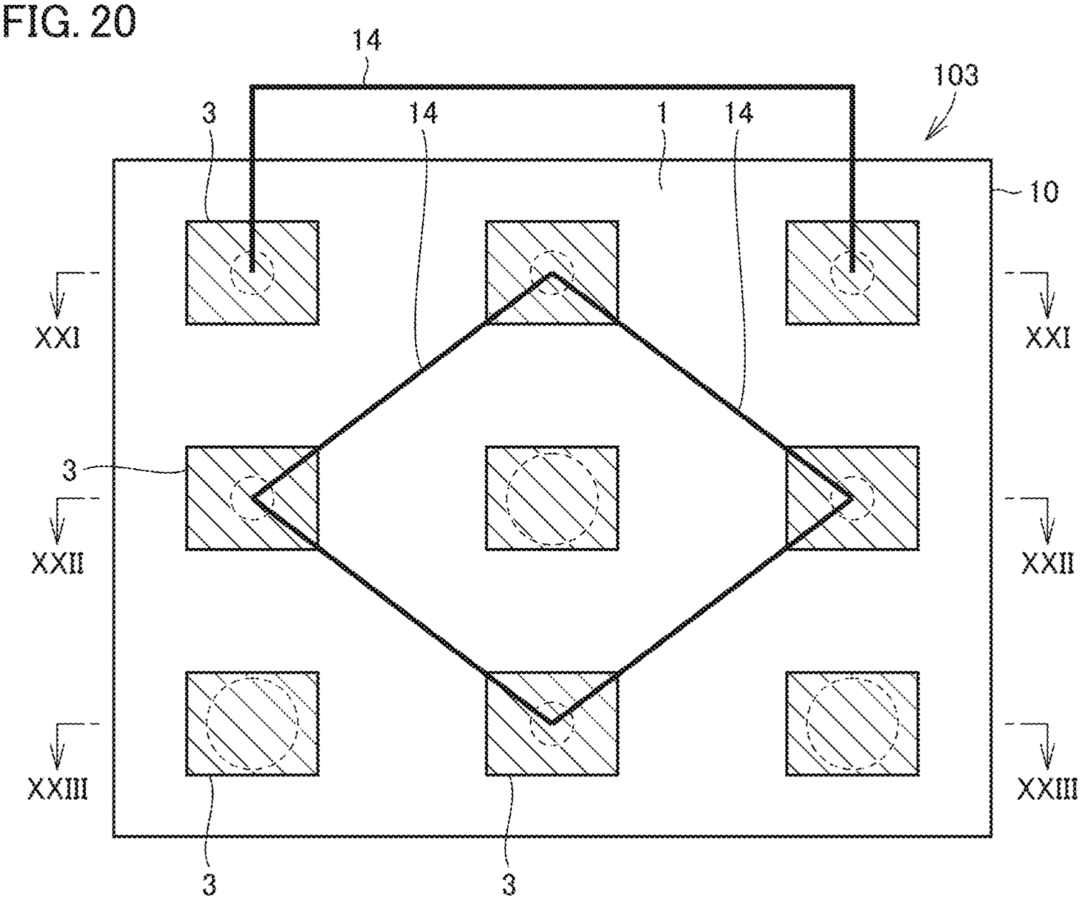
FIG. 20 is a bottom view of an electronic component in a third embodiment based on the present disclosure.
Figure 21:
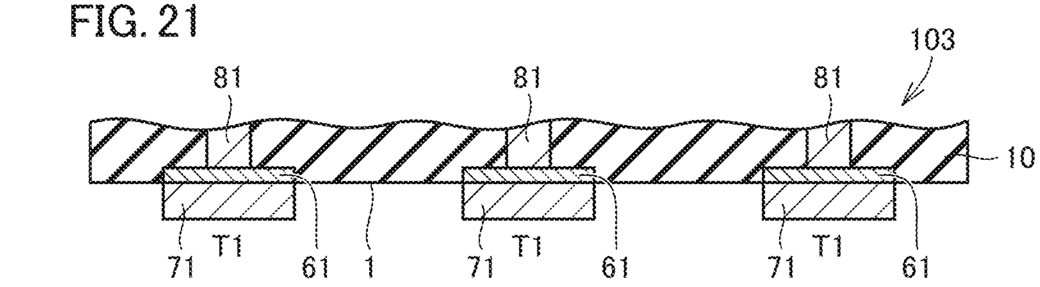
FIG. 21 is a cross-sectional view along the line XXI-XXI in FIG. 20.
Figure 22:
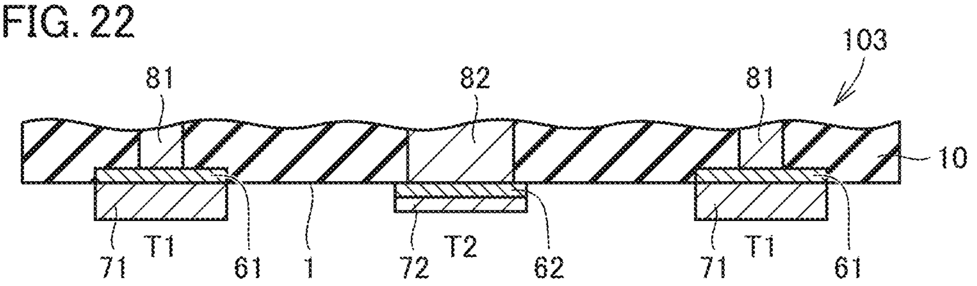
FIG. 22 is a cross-sectional view along the line XXII-XXII in FIG. 20.
Figure 23:
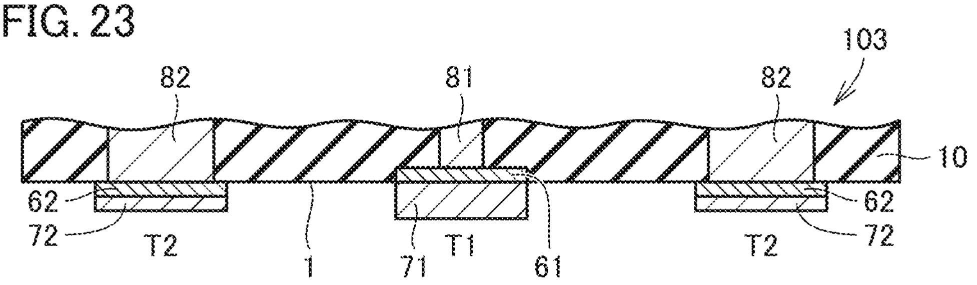
FIG. 23 is a cross-sectional view along the line XXIII-XXIII in FIG. 20.

An electronic component in a third embodiment based on the present disclosure will be described with reference to FIGS. 20 to 23. FIG. 20 shows a bottom view of an electronic component 103 in the present embodiment. FIG. 21 shows a cross-sectional view along the line XXI-XXI in FIG. 20. FIG. 22 shows a cross-sectional view along the line XXII-XXII in FIG. 20. FIG. 23 shows a cross-sectional view along the line XXIII-XXIII in FIG. 20.

The plurality of electrodes 3 on first surface 1 of electronic component 103 also include first-type electrodes T1 and second-type electrodes T2 as described in the first and second embodiments. In this example, as shown in FIG. 20, six first-type electrodes T1 and three second-type electrodes T2 are arranged on first surface 1. Since the embodiment is otherwise the same as the described second embodiment, description will not be repeated.

The present embodiment can also obtain the effects as described in the first and second embodiments.

The shape, the position, the number, and the like of electrodes 3 shown in each embodiment are shown merely by way of example, and they are not necessarily as shown. The number of interconnections 14, a component to which interconnection 14 is connected, or the like shown in each embodiment is shown merely by way of example, and it is not necessarily as shown.

Fourth Embodiment

Figure 24:
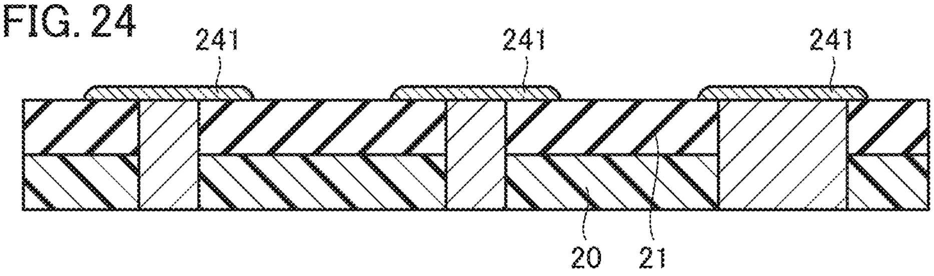
FIG. 24 is a first illustrative view of a state in the middle of manufacturing of an electronic component in a fourth embodiment based on the present disclosure.
Figure 25:
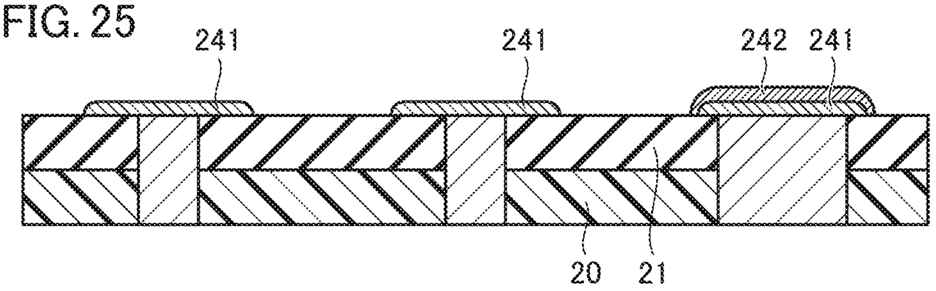
FIG. 25 is a second illustrative view of a state in the middle of manufacturing of an electronic component in the fourth embodiment based on the present disclosure.

An electronic component in a fourth embodiment based on the present disclosure will be described with reference to FIGS. 24 to 26. FIGS. 24 and 25 show some steps in a manufacturing method performed for obtaining an electronic component 104 in the present embodiment. These figures show printing of a conductive paste for formation of a conductor pattern.

Ceramic green sheet 21 is supported by carrier film 20. Through hole 22 is filled with conductive paste 23. As shown in FIG. 24, a conductive film 241 is printed on the surface of ceramic green sheet 21. Furthermore, as shown in FIG. 25, a conductive film 242 is printed to be layered only on at least one of conductive films 241. A portion where only a single layer of conductive film 241 is provided and a portion in a two-layered structure of conductive films 241 and 242 are thus both present. The former is a portion to be first-type electrode T1 and the latter is a portion to be second-type electrode T2. These conductive films will be underlying electrodes. Thus, an underlying electrode small in thickness and an underlying electrode large in thickness are both present on first surface 1.

Figure 26:
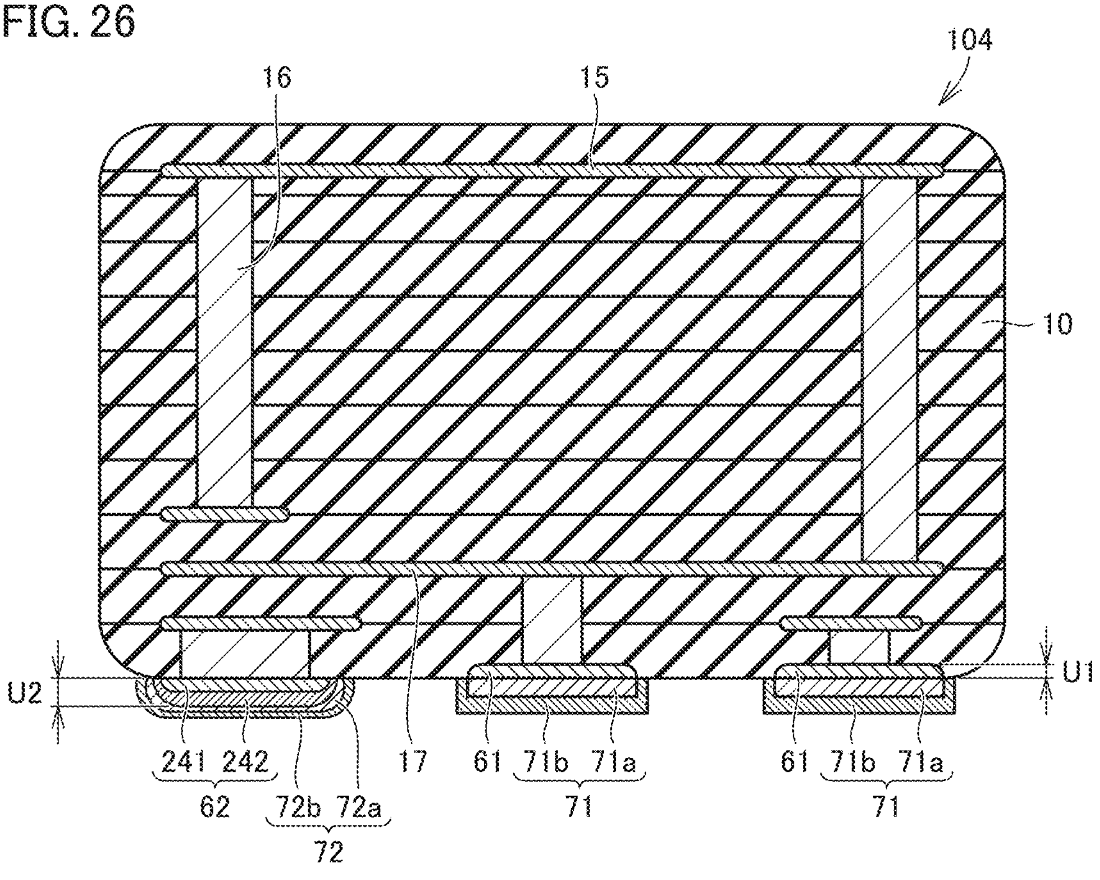
FIG. 26 is a cross-sectional view of the electronic component in the fourth embodiment based on the present disclosure.

FIG. 26 shows a state in which a plurality of ceramic green sheets 21 are layered and pressed, cut into a size of an individual electronic component, subjected to barrel polishing, and further subjected to plating treatment. Electronic component 104 is thus obtained.

In FIG. 26, two electrodes on the right are first-type electrodes, and one electrode on the left is the second-type electrode. In electronic component 104, second underlying electrode 62 includes conductive films 241 and 242. Therefore, second underlying electrode 62 is larger in thickness than first underlying electrode 61. As shown in FIG. 26, relation of U1<U2 is satisfied, where U1 represents a thickness of first underlying electrode 61 and U2 represents a thickness of second underlying electrode 62. First plated film 71 includes plated films 71*a* and 71*b*. Second plated film 72 includes plated films 72*a* and 72*b*. Second plated film 72 is smaller in thickness than first plated film 71. Consequently, positions of lower surfaces of the electrodes each of which is formed from combination of the underlying electrode and the plated film are located at a substantially uniform height.

In the present embodiment, the underlying electrode small in thickness as first-type electrode T1 and the underlying electrode large in thickness as second-type electrode T2 are arranged on first surface 1 by making the number of times of printing different. Therefore, after plating treatment, influence by a difference in rate of growth of plating is cancelled to some extent. Therefore, an electronic component reduced in variation in height of surfaces of the electrodes can be obtained. In addition to the difference in degree of sinking caused by the difference in rigidity of the via connected to the underlying electrode as described in the first embodiment, the thickness itself of the underlying electrode is different in the present embodiment. Therefore, variation in height of the surfaces of the electrodes can more readily be reduced.

Though there are a portion where the conductive paste is printed once and a portion where the conductive paste is printed two times in order to make the thickness of the underlying electrode different in the present embodiment, the number of times of printing is not limited as such. Printing may be performed three times or more in order to form the underlying electrode. Though the number of times of printing for formation of the underlying electrode smaller in thickness is set to once, the number of times of printing is not limited to one. Printing for formation of the underlying electrode smaller in thickness may be performed a plurality of times, and printing for formation of the underlying electrode larger in thickness may be performed a larger number of times.

Fifth Embodiment

Figure 27:
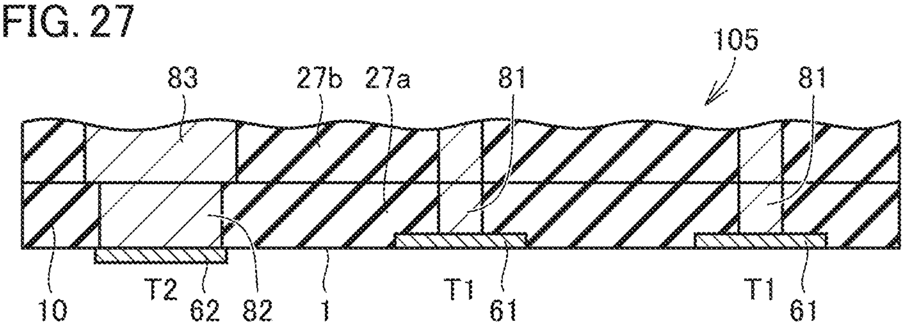
FIG. 27 is a partial cross-sectional view of an electronic component in a fifth embodiment based on the present disclosure.

An electronic component in a fifth embodiment based on the present disclosure will be described with reference to FIG. 27. FIG. 27 show a partial cross-sectional view of an electronic component 105 in the present embodiment. Main body 10 of electronic component 105 includes an insulating layer 27*a* at a position closest to first surface 1 and includes an insulating layer 27*b* at a position second closest to first surface 1. First via 81 and second via 82 are arranged to pass through insulating layer 27*a*.

Electronic component 105 includes a third via 83 connected to second via 82 from a side opposite to second underlying electrode 62, in the inside of main body 10. Third via 83 is arranged to pass through insulating layer 27*b*. A cross-sectional area of third via 83 along the plane in parallel to first surface 1 is larger than the cross-sectional area of second via 82 along the plane in parallel to first surface 1.

The present embodiment can also obtain the effect as described in the first embodiment. In particular, in the present embodiment, third via 83 is arranged, and third via 83 can be a structure high in rigidity. Though it is difficult to arrange in insulating layer 27*a* closest to first surface 1, a via having a size larger than second underlying electrode 62 when viewed from directly below, the via having a size larger than second underlying electrode 62 when viewed directly below can be arranged in insulating layer 27*b* second closest to first surface 1, and a degree of freedom in design is higher. An amount of sinking of second-type electrode T2 into main body 10 in pressing can readily be made smaller by increasing a diameter of third via 83 as appropriate.

Sixth Embodiment

Figure 28:
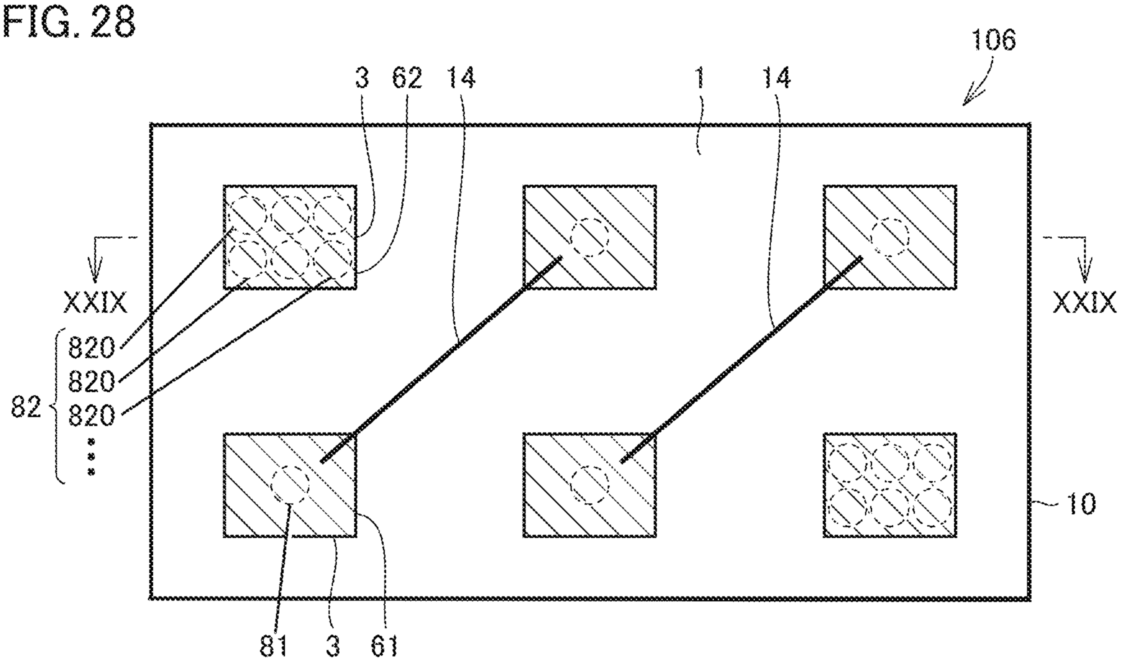
FIG. 28 is a bottom view of an electronic component in a sixth embodiment based on the present disclosure.
Figure 29:
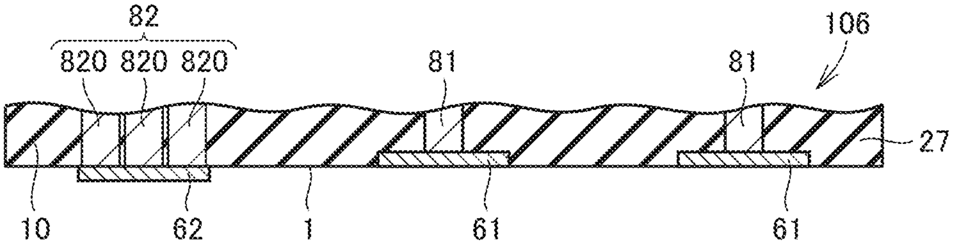
FIG. 29 is a cross-sectional view along the line XXIX-XXIX in FIG. 28.

An electronic component in a sixth embodiment based on the present disclosure will be described with reference to FIG. 28. FIG. 28 shows a bottom view of an electronic component 106 in the present embodiment. FIG. 29 shows a cross-sectional view along the line XXIX-XXIX in FIG. 28. Strictly speaking, though the line XXIX-XXIX in FIG. 28 does not pass through three via elements 820 connected to electrode 3 located on the leftmost side in FIG. 28, FIG. 29 also shows cross-sections of these three via elements 820 for the sake of convenience of description.

Four first-type electrodes T1 and two second-type electrodes T2 are arranged on first surface 1 of electronic component 106.

In electronic component 106, second via 82 includes a plurality of via elements 820. Each of the plurality of via elements 820 is connected to second underlying electrode 62. In other words, the plurality of via elements 820 are connected to a single second underlying electrode 62. More specifically, six via elements 820 are connected to a single second underlying electrode 62.

A shortest distance between a contour line of second via 82 and a contour line of second underlying electrode 62 is shorter than a shortest distance between a contour line of first via 81 and a contour line of first underlying electrode 61 when viewed two-dimensionally.

The present embodiment can also obtain the effects as described in the first embodiment and the like. Furthermore, since the plurality of via elements 820 are connected to a single second underlying electrode 62, via element 820 can be arranged also in an outer peripheral portion of second underlying electrode 62, and support with sufficient rigidity also in the outer peripheral portion of second underlying electrode 62 during pressing can be achieved. Sinking of second underlying electrode 62 during pressing can thus effectively be suppressed.

Figure 30:
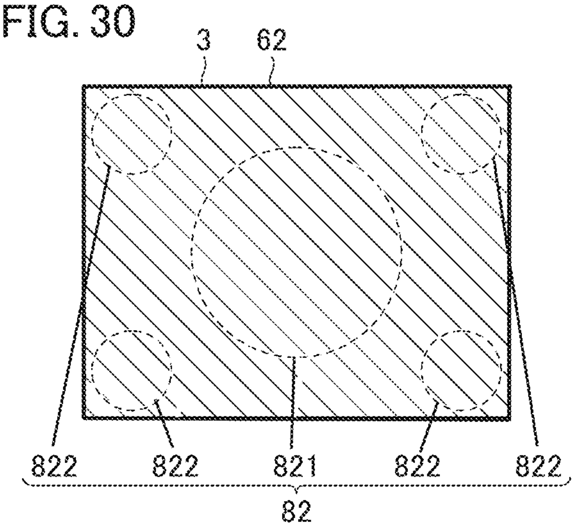
FIG. 30 is a plan view showing positional relation between a second via and a second underlying electrode included in a modification of the electronic component in the sixth embodiment based on the present disclosure.

Though an example in which six via elements 820 are connected to a single second underlying electrode 62 is shown and illustrated in the present embodiment, the number of via elements 820 connected to a single second underlying electrode 62 may be set to a number other than six. In the present embodiment, a plurality of via elements 820 are connected to a single second underlying electrode 62 and these via elements 820 are identical in size. As shown in FIG. 30, however, a via element different in size may also be present.

In the example shown in FIG. 30, a plurality of via elements include a first via element 821 of a first diameter and a second via element 822 of a second diameter smaller than the first diameter, and second via element 822 is arranged to be connected at a position closer to a corner of second underlying electrode 62 than first via element 821. By thus combining via elements different in diameter, the via element can efficiently be arranged also in the outer peripheral portion of second underlying electrode 62. As the via element is smaller in diameter, it can be arranged as being closer to the corner of second underlying electrode 62. Therefore, sinking of second underlying electrode 62 during pressing can effectively be suppressed also in the outer peripheral portion of second underlying electrode 62.

Seventh Embodiment

Figure 31:
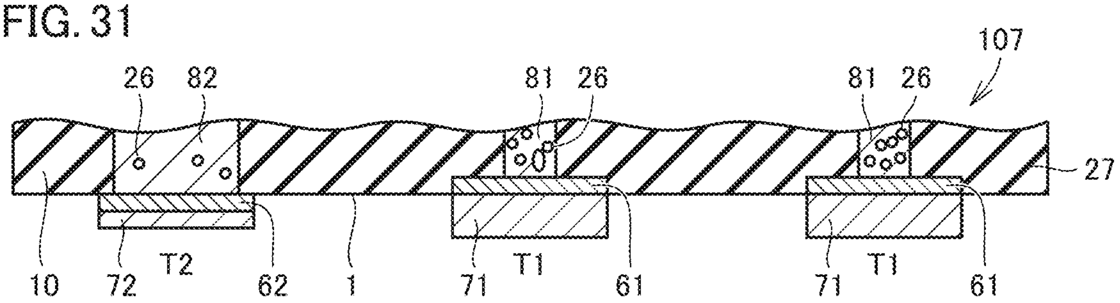
FIG. 31 is a partial cross-sectional view of an electronic component in a seventh embodiment based on the present disclosure.

An electronic component in a seventh embodiment based on the present disclosure will be described with reference to FIG. 31. FIG. 31 shows a partial cross-sectional view of an electronic component 107 in the present embodiment.

In electronic component 107, first via 81 and second via 82 each include pores 26. The number of pores 26 per unit volume in second via 82 is smaller than the number of pores 26 per unit volume in first via 81. The number of pores 26 as such can be adjusted by setting how much resin component is to be contained in filling the through hole with the conductive paste. Pores 26 refer to a cavity originating from the resin component and provided at the time of firing. In making electronic component 107, a through hole at a location to be first-type electrode T1 is desirably filled with a conductive paste containing a larger amount of resin component, and a through hole at a location to be second-type electrode T2 is desirably filled with a conductive paste containing a smaller amount of conductive paste. Pores 26 shown in FIG. 31 are shown schematically for the sake of convenience of description.

Second via 82 is smaller in number of pores 26 per unit volume than first via 81, and hence a shrinkage at the time of firing of the multilayer body is low. In other words, second via 82 does not shrink much but is in a stretched state in firing. In the present embodiment, using this property, variation in height of the surfaces of the electrodes can more readily be reduced.

A plurality of embodiments of the embodiments above may be adopted in combination as appropriate.

[Additional Aspect 1]

An electronic component includes a main body provided with a first surface and a plurality of electrodes arranged on the first surface, the plurality of electrodes include first-type electrodes individually arranged on the first surface and connected to each other through an interconnection that passes through the inside of the main body and a second-type electrode not connected to other electrodes individually arranged on the first surface, the first-type electrodes each include a first underlying electrode and a first plated film that covers the first underlying electrode, the second-type electrode includes a second underlying electrode and a second plated film that covers the second underlying electrode, and the first underlying electrode sinks into the main body as compared with the second underlying electrode.

[Additional Aspect 2]

In the electronic component according to Additional Aspect 1, the second underlying electrode is larger in thickness than the first underlying electrode.

[Additional Aspect 3]

The electronic component according to Additional Aspect 1 or 2 includes a first via connected to the first underlying electrode in the inside of the main body and a second via connected to the second underlying electrode in the inside of the main body, and a cross-sectional area of the second via along a plane in parallel to the first surface is larger than a cross-sectional area of the first via along the plane in parallel to the first surface.

[Additional Aspect 4]

The electronic component according to Additional Aspect 3 includes a third via connected to the second via from a side opposite to the second underlying electrode in the inside of the main body, and a cross-sectional area of the third via along the plane in parallel to the first surface is larger than the cross-sectional area of the second via along the plane in parallel to the first surface.

[Additional Aspect 5]

In the electronic component according to Additional Aspect 3 or 4, the second via includes a plurality of via elements, each of the plurality of via elements is connected to the second underlying electrode, and a shortest distance between a contour line of the second via and a contour line of the second underlying electrode is shorter than a shortest distance between a contour line of the first via and a contour line of the first underlying electrode when viewed two-dimensionally.

[Additional Aspect 6]

In the electronic component according to Additional Aspect 5, the plurality of via elements include a first via element of a first diameter and a second via element of a second diameter smaller than the first diameter, and the second via element is arranged to be connected at a position closer to a corner of the second underlying electrode than the first via element.

[Additional Aspect 7]

In the electronic component according to any one of Additional Aspects 3 to 6, the first via and the second via each include pores, and the number of pores per unit volume in the second via is smaller than the number of pores per unit area in the first via.

The embodiments disclosed herein are illustrative and non-restrictive in every respect. The scope of the present disclosure is defined by the terms of the claims and includes any modifications within the scope and meaning equivalent to the terms of the claims.

1 first surface; 2 second surface; 3 electrode; 4 curved portion; 6 underlying electrode; 7 plated film; 8 via; 61 first underlying electrode; 62 second underlying electrode; 71 first plated film; 71*a*, 71*b* plated film; 72 second plated film; 72*a*, 72*b* plated film; 81 first via; 82 second via; 83 third via; 10 main body; 11 substrate assembly; 12 elemental body; 13 cut plane; 14 interconnection; 15, 17 conductor pattern; 16 conductor via; 20 carrier film; 21 ceramic green sheet; 22, 22*a*, 22*b* through hole; 23 conductive paste; 24 conductor pattern; 25 carrier sheet; 26 pore; 27, 27*a*, 27*b* insulating layer; 101, 102, 103, 104, 105, 106, 107 electronic component; 241, 242 conductive film; 820 via element; 821 first via element; 822 second via element.

The invention claimed is:

1. An electronic component comprising:

a main body provided with a first surface; and a plurality of electrodes arranged on the first surface, wherein the plurality of electrodes include first-type electrodes individually arranged on the first surface and connected to each other through an interconnection passing through inside of the main body, and a second-type electrode not connected to other electrodes individually arranged on the first surface, the first-type electrodes each include a first underlying electrode and a first plated film covering the first underlying electrode, the second-type electrode includes a second underlying electrode and a second plated film covering the second underlying electrode, and the first underlying electrode sinks into the main body as compared with the second underlying electrode.

2. The electronic component according to claim 1, wherein the second underlying electrode is thicker than the first underlying electrode.

3. The electronic component according to claim 2, further comprising:

a first via connected to the first underlying electrode in the inside of the main body; and a second via connected to the second underlying electrode in the inside of the main body, wherein a cross-sectional area of the second via along a plane in parallel to the first surface is larger than a cross-sectional area of the first via along the plane in parallel to the first surface.

4. The electronic component according to claim 1, further comprising:

a first via connected to the first underlying electrode in the inside of the main body; and a second via connected to the second underlying electrode in the inside of the main body, wherein a cross-sectional area of the second via along a plane in parallel to the first surface is larger than a cross-sectional area of the first via along the plane in parallel to the first surface.

5. The electronic component according to claim 4, further comprising a third via connected to the second via from a side opposite to the second underlying electrode in the inside of the main body, wherein a cross-sectional area of the third via along the plane in parallel to the first surface is larger than the cross-sectional area of the second via along the plane in parallel to the first surface.

6. The electronic component according to claim 5, wherein the second via includes a plurality of via elements, each of the plurality of via elements is connected to the second underlying electrode, and a shortest distance between a contour line of the second via and a contour line of the second underlying electrode is shorter than a shortest distance between a contour line of the first via and a contour line of the first underlying electrode when viewed two-dimensionally.

7. The electronic component according to claim 5, wherein the first via and the second via each include pores, and a number of pores per unit volume in the second via is fewer than a number of pores per unit area in the first via.

8. The electronic component according to claim 4, wherein the second via includes a plurality of via elements, each of the plurality of via elements is connected to the second underlying electrode, and a shortest distance between a contour line of the second via and a contour line of the second underlying electrode is shorter than a shortest distance between a contour line of the first via and a contour line of the first underlying electrode when viewed two-dimensionally.

9. The electronic component according to claim 8, wherein the plurality of via elements include a first via element of a first diameter and a second via element of a second diameter smaller than the first diameter, and the second via element is arranged to be connected at a position closer to a corner of the second underlying electrode than the first via element.

10. The electronic component according to claim 9, wherein the first via and the second via each include pores, and a number of pores per unit volume in the second via is fewer than a number of pores per unit area in the first via.

11. The electronic component according to claim 8, wherein the first via and the second via each include pores, and a number of pores per unit volume in the second via is fewer than a number of pores per unit area in the first via.

12. The electronic component according to claim 4, wherein the first via and the second via each include pores, and a number of pores per unit volume in the second via is fewer than a number of pores per unit area in the first via.

* * * * *